(12) United States Patent
Nogami

(10) Patent No.: US 7,442,644 B2
(45) Date of Patent: Oct. 28, 2008

(54) METHOD FOR MANUFACTURING NITRIDE SEMICONDUCTOR WAFER OR NITRIDE SEMICONDUCTOR DEVICE; NITRIDE SEMICONDUCTOR WAFER OR NITRIDE SEMICONDUCTOR DEVICE MADE BY THE SAME; AND LASER IRRADIATING APPARATUS USED FOR THE SAME

(75) Inventor: Yoichi Nogami, Anan (JP)

(73) Assignee: Nichia Corporation, Anan-shi, Tokushima (JP)

( * ) Notice: Subject to any disclaimer, the term of this patent is extended or adjusted under 35 U.S.C. 154(b) by 321 days.

(21) Appl. No.: 11/184,832

(22) Filed: Jul. 20, 2005

(65) Prior Publication Data
US 2006/0189017 A1 Aug. 24, 2006

(30) Foreign Application Priority Data
Jul. 21, 2004 (JP) ............................ P2004-213122
Jul. 20, 2005 (JP) ............................ P2005-210336

(51) Int. Cl.
*H01L 21/302* (2006.01)

(52) U.S. Cl. ........................ 438/689; 438/738; 438/940; 438/662; 257/E21.347; 257/E21.475; 257/E21.591; 257/E21.305; 156/653.1

(58) Field of Classification Search ................. 438/689, 438/738, 940, 662; 257/E21.347, E21.475, 257/E21.591, E21.305
See application file for complete search history.

(56) References Cited

U.S. PATENT DOCUMENTS

| 5,620,557 | A | | 4/1997 | Manabe et al. |
| 6,121,639 | A | * | 9/2000 | Van de Walle ............... 257/103 |
| 6,245,687 | B1 | | 6/2001 | Barsky et al. |
| 6,303,405 | B1 | | 10/2001 | Yoshida et al. |
| 6,616,757 | B1 | * | 9/2003 | Melnik et al. ................ 117/102 |
| 6,617,261 | B2 | * | 9/2003 | Wong et al. .................. 438/778 |
| 6,815,368 | B2 | * | 11/2004 | Chen ........................... 438/751 |
| 6,897,139 | B2 | * | 5/2005 | Shibata et al. ............... 438/606 |
| 2002/0115265 | A1 | * | 8/2002 | Iwafuchi et al. .............. 438/458 |
| 2004/0072383 | A1 | * | 4/2004 | Nagahama et al. ............ 438/47 |

(Continued)

FOREIGN PATENT DOCUMENTS

EP    1 120 483 A2    8/2001

(Continued)

OTHER PUBLICATIONS

R. Sathyamoorthy and S.Senthilarasu, Influence of RMS strain on optical band gap of ZnPc thin films, Dec. 2004, Solar Energy vol. 80, Issue 2, Feb. 2006, pp. 201-208.*

(Continued)

*Primary Examiner*—Ha Tran T Nguyen
*Assistant Examiner*—Chakila Tillie
(74) *Attorney, Agent, or Firm*—Birch, Stewart, Kolasch and Birch, LLP

(57) ABSTRACT

To remove the disparate substrate from nitride semiconductor layer grown over the disparate substrate, that is made of a material different from nitride semiconductor, by irradiating the disparate substrate with laser beam having a wavelength shorter than the band gap wavelength of the nitride semiconductor layer, while supplying an acidic or alkaline etching solution to the interface between the disparate substrate and the nitride semiconductor layer.

14 Claims, 8 Drawing Sheets

U.S. PATENT DOCUMENTS

2004/0147096 A1*  7/2004  Kitaoka et al. .............. 438/483

FOREIGN PATENT DOCUMENTS

| JP | 7-202265 A | 8/1995 |
|---|---|---|
| JP | 11-229199 A | 8/1999 |
| JP | 2000-101139 A | 4/2000 |
| JP | 2001-250809 A | 9/2001 |
| JP | 2003-158113 A | 5/2003 |
| JP | 2003-179027 A | 6/2003 |
| JP | 2003-188142 A | 7/2003 |
| JP | 2003-218087 A | 7/2003 |
| JP | 2003-304036 A | 10/2003 |
| JP | 2004-91278 A | 3/2004 |

OTHER PUBLICATIONS

Stonas et al., "Photoelectrochemical undercut etching for fabrication of GaN microelectromechanical systems", J. Vac. Sci. Technol. B, vol. 19, No. 6 (Nov./Dec. 2001) pp. 2838-2841.

* cited by examiner

METHOD FOR MANUFACTURING NITRIDE SEMICONDUCTOR WAFER OR NITRIDE SEMICONDUCTOR DEVICE; NITRIDE SEMICONDUCTOR WAFER OR NITRIDE SEMICONDUCTOR DEVICE MADE BY THE SAME; AND LASER IRRADIATING APPARATUS USED FOR THE SAME

BACKGROUND OF THE INVENTION

1. Field of the Invention

The present invention relates to a method for manufacturing a nitride semiconductor wafer or a nitride semiconductor device, the nitride semiconductor wafer or the nitride semiconductor device obtained thereby and a laser irradiation apparatus used therefor. More particularly, the present invention relates to a method for manufacturing a nitride semiconductor wafer or a nitride semiconductor device that is provided with the step of removing a disparate substrate made of a material different from nitride semiconductor.

2. Description of the Related Art

When manufacturing a nitride semiconductor wafer or a nitride semiconductor device, it may become necessary to separate nitride semiconductor layer from a disparate substrate that is made of such a material as sapphire or SiC. For example, a nitride semiconductor wafer made of a free-standing nitride semiconductor is generally manufactured by growing a thick nitride semiconductor layer over the disparate substrate such as sapphire, and then removing the disparate substrate. When an UV LED is manufactured, a device layer is formed intervening a GaN layer that would make an underlying layer for crystal growth over a disparate substrate such as sapphire, a support substrate such as CuW is fastened onto the top surface of the device layer, the disparate substrate is removed from the GaN underlying layer, and the GaN underlying layer is removed by polishing thereby to form the device, in a certain case.

As a method for removing the disparate substrate from the nitride semiconductor layer, following methods are known:
(1) To remove the disparate substrate by irradiating the interface between the disparate substrate and the nitride semiconductor with laser beam (Japanese Unexamined Patent Publication (Kokai) No. 2004-91278, Japanese Unexamined Patent Publication (Kokai) No. 2000-101139)
(2) To remove the disparate substrate by polishing.
(3) To form a lift-off layer between the disparate substrate and the nitride semiconductor, then remove the disparate substrate by applying a stress to the lift-off layer (Japanese Unexamined Patent Publication (Kokai) No. 2000-101139)
(4) To form a layer of such a material that can be removed by etching between the disparate substrate and the nitride semiconductor, then remove the disparate substrate by etching away the layer of this material (Japanese Unexamined Patent Publication (Kokai) No. 7-202265)

Among these methods, the method of lifting off the disparate substrate by means of laser irradiation is most widely employed since it does not require the use of a special material and allows easy application in a short period of time. In this method, laser beam of a wavelength that has high absorption rate with the nitride semiconductor is irradiated from the disparate substrate side, so as to decompose the nitride semiconductor located near the interface into nitrogen and metal.

When the disparate substrate is removed from the nitride semiconductor layer by irradiating with laser beam, however, there has been such a case as the nitride semiconductor is not fully decomposed in a portion of the wafer, or the nitride semiconductor layer turns into a state of being fused, and a part of the nitride semiconductor layer is broken and lifted off along with the disparate substrate. Since intensity of the laser beam is distributed in a certain pattern, the wafer is not irradiated with uniform intensity of the laser beam. As a result, there can occur such a case as the nitride semiconductor is not fully decomposed in a region of the wafer and a metal produced by the decomposition bonds the nitride semiconductor layer and the disparate substrate. In this case, a fused portion of the nitride semiconductor layer and the disparate substrate remains on the wafer surface without being removed. Under this condition, nitrogen gas generated through the decomposition of the nitride semiconductor layer presses the nitride semiconductor layer in the fused portion, thus making it likely that the nitride semiconductor layer is broken. Existence of the fused portion also makes it necessary to apply a mechanical stress to completely remove the disparate substrate, which may also break the nitride semiconductor layer, thus leaving fragments of the broken nitride semiconductor layer over the disparate substrate. Moreover, removal of the disparate substrate by the irradiation of laser beam results in unsatisfactory surface condition of the nitride semiconductor layer, which requires mechanical polishing to make the surface smooth.

SUMMARY OF THE INVENTION

An object of the present invention is to provide a method for manufacturing a nitride semiconductor wafer or a nitride semiconductor device that includes the step of removing a disparate substrate, wherein the nitride semiconductor layer is prevented from breaking when removing the disparate substrate. It is also an object of the invention to provide a method for smoothing the surface that results from removing the disparate substrate.

In order to achieve the objects described above, in a first aspect of the present invention, the disparate substrate is removed by irradiating the disparate substrate with a laser beam of a wavelength shorter than the band gap wavelength of the nitride semiconductor layer in an acidic or alkaline etching solution, during the process of manufacturing a nitride semiconductor wafer or a nitride semiconductor device. In a second aspect of the present invention, an underlying layer that has been provided when forming the device structure of nitride semiconductor is removed by etching in an acidic or alkaline etching solution while irradiating with a laser beam of a wavelength shorter than the band gap wavelength of the underlying layer.

The band gap wavelength of the nitride semiconductor layer refers to the wavelength of a radiation that corresponds to the band gap energy of the nitride semiconductor layer. For example, gallium nitride has a band gap energy of 3.4 eV, which corresponds to about 365 nm of band gap wavelength. In case the nitride semiconductor layer consists of a plurality of layers, wavelength of light is determined over the basis of the band gap energy of the part of the nitride semiconductor layer that is located in the interface with the disparate substrate and is to be decomposed by irradiation (for example, the underlying layer to be described later). In this specification, emission in ultraviolet region means the emission of radiation having wavelengths not longer than 420 nm. In this specification, the term "ultraviolet rays" means those of wavelengths not longer than 420 nm.

When the nitride semiconductor is irradiated with light of short wavelength, the nitride semiconductor layer absorbs the light and is heated to a high temperature so as to decompose into nitrogen and metal, while electron-hole pairs are excited in the nitride semiconductor layer so that etching rate of chemical etching becomes very high. Therefore, irradiation of the disparate substrate with a laser beam in an acidic or alkaline etching solution causes the thermal decomposition of the nitride semiconductor layer and the chemical etching to proceed at the same time in the portion being irradiated. This causes the disparate substrate to be lifted off evenly over the entire surface and makes the resultant surface of the nitride semiconductor layer very smooth. As a result, not only the nitride semiconductor layer can be prevented from breaking during removal of the disparate substrate, but also the nitride semiconductor layer having very smooth surface of mirror quality can be obtained.

During etching of the underlying layer, too, irradiation with excitation light of short wavelength increases the etching rate of the nitride semiconductor by the excitation effect of the light and increases the difference in the etching rate between the underlying layer and the crystal layer formed thereon or the material that makes the device structure. As a result, the underlying layer can be removed by selective or preferential etching. Also because the wafer surface that has the device structure after removing the underlying layer can be made very flat, this process contributes to the improvement of the efficiency of volume production.

DESCRIPTION OF THE PREFERRED EMBODIMENTS

Preferred embodiments of the present invention will now be described with reference to the accompanying drawings.

Embodiment 1

Figure 1:
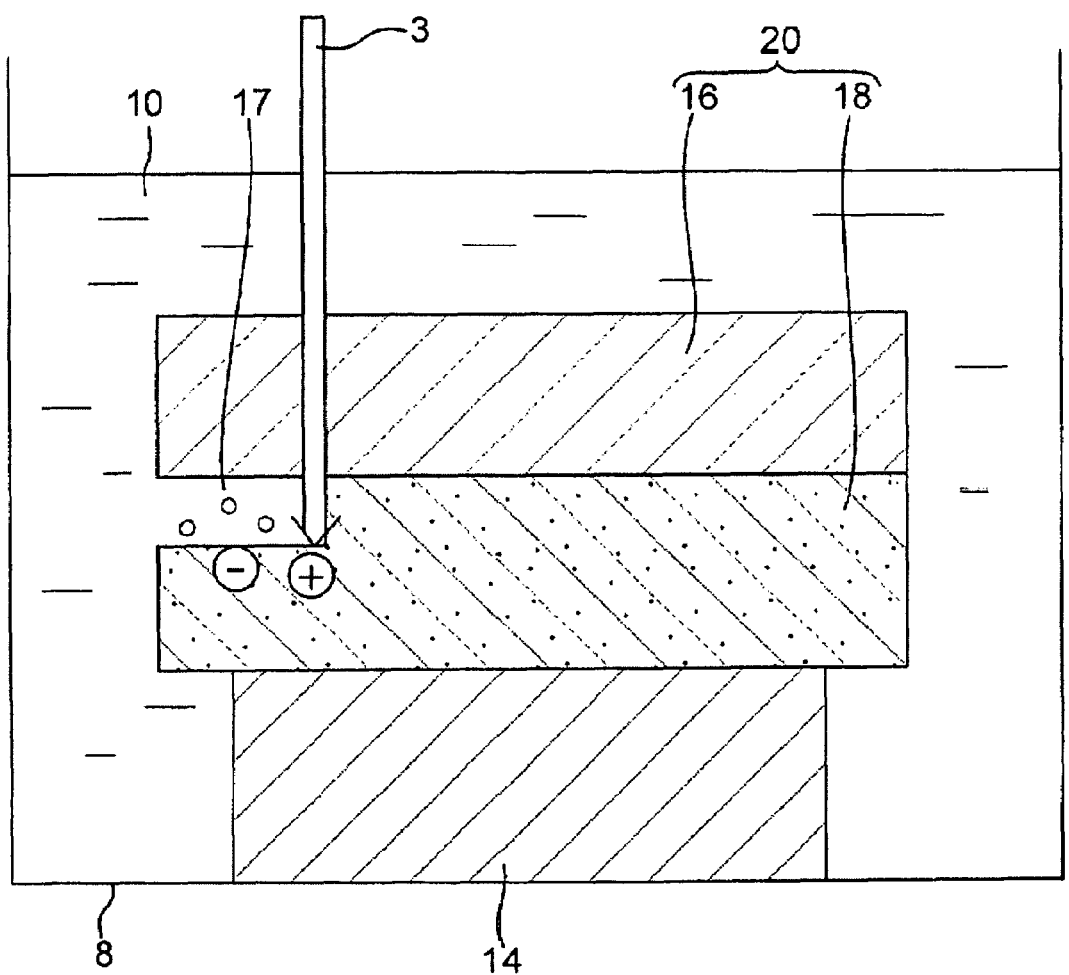
FIG. 1 is a schematic diagram showing the step of removing a disparate substrate in a first embodiment.

FIG. 1 is a schematic diagram showing a characteristic portion of the method of manufacturing a nitride semiconductor wafer or a nitride semiconductor device according to the present invention, namely the step of removing a disparate substrate 16 from a wafer 20 whereon a nitride semiconductor layer 18 has been grown on the disparate substrate 16. As shown in FIG. 1, an etching bath 8 contains an acidic or alkaline etching solution 10 in which the wafer 20 is held on a holder 14. The wafer 20 is held so that the disparate substrate 16 faces upward and is irradiated with laser beam 3.

Figure 2:
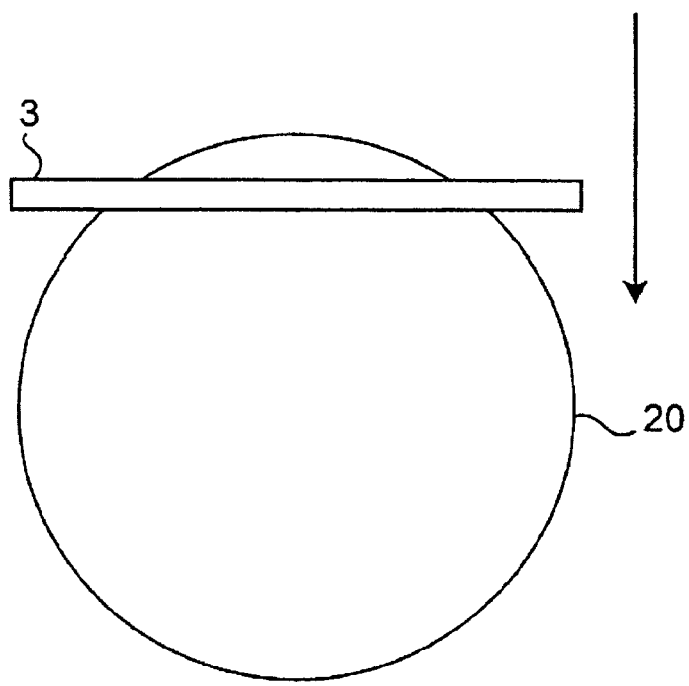
FIG. 2 is a top view schematically showing the state of a crystal growth wafer being irradiated with laser beam.

The laser beam 3 has a linear beam shape as shown in FIG. 2, and is scanned in a direction perpendicular to the longitudinal direction of the beam so as to sweep the entire surface of the wafer 20. Laser beam 3 has a wavelength shorter than the band gap wavelength of the nitride semiconductor layer 18. In case the nitride semiconductor 18 is made of GaN, the laser beam has a wavelength shorter than about 365 nm that corresponds to the band gap energy 3.4 eV of GaN. Wavelength of the laser 3 is also selected to be longer than the band gap wavelength of the disparate substrate 16, so as not to be absorbed by the disparate substrate 16. When the disparate substrate 16 is irradiated with the laser beam having such properties as described above, the nitride semiconductor layer 18 located near the interface with the disparate substrate 16 absorbs the energy so as to be locally heated, thereby to decompose into metal and nitrogen.

Figure 3:
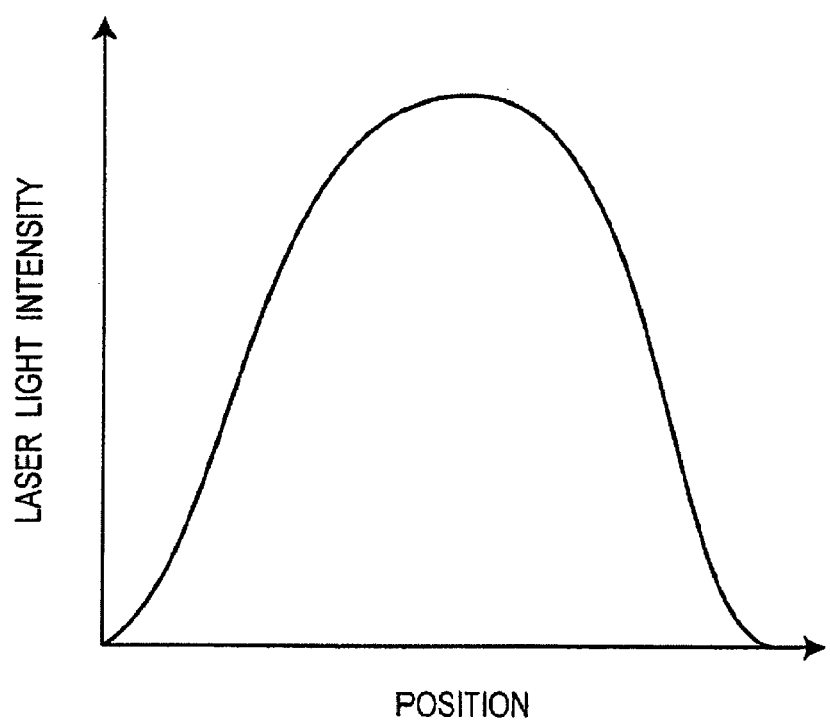
FIG. 3 is a graph showing an example of intensity distribution of laser beam.

Linear shape of the laser beam 3 is made by transforming a substantially elliptical beam by means of a predetermined lens system, and therefore has such an intensity distribution as shown in FIG. 3 where the intensity is stronger at a position near the center of the beam than the periphery of the beam. Therefore, when the wafer 20 is irradiated with the laser beam 3 in air atmosphere as in the prior art, thermal decomposition occurs insufficiently near the peripheral portion of the wafer.

Figure 4A:
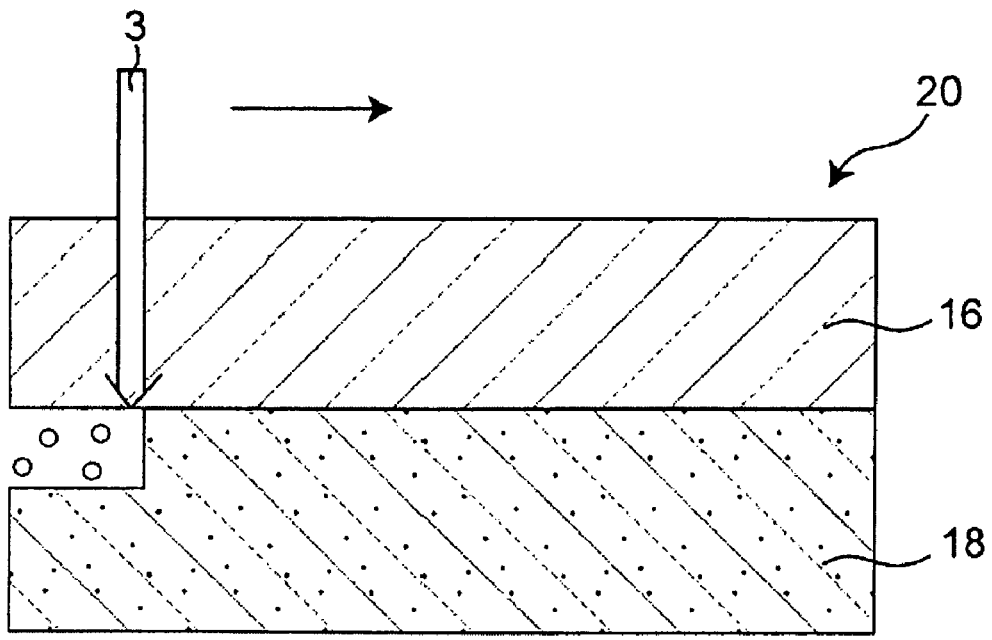
FIG. 4A is a sectional view schematically showing the state of interface between the disparate substrate and the nitride semiconductor layer being irradiated with laser beam in air atmosphere in a section parallel to the direction of scanning the laser beam.
Figure 4B:
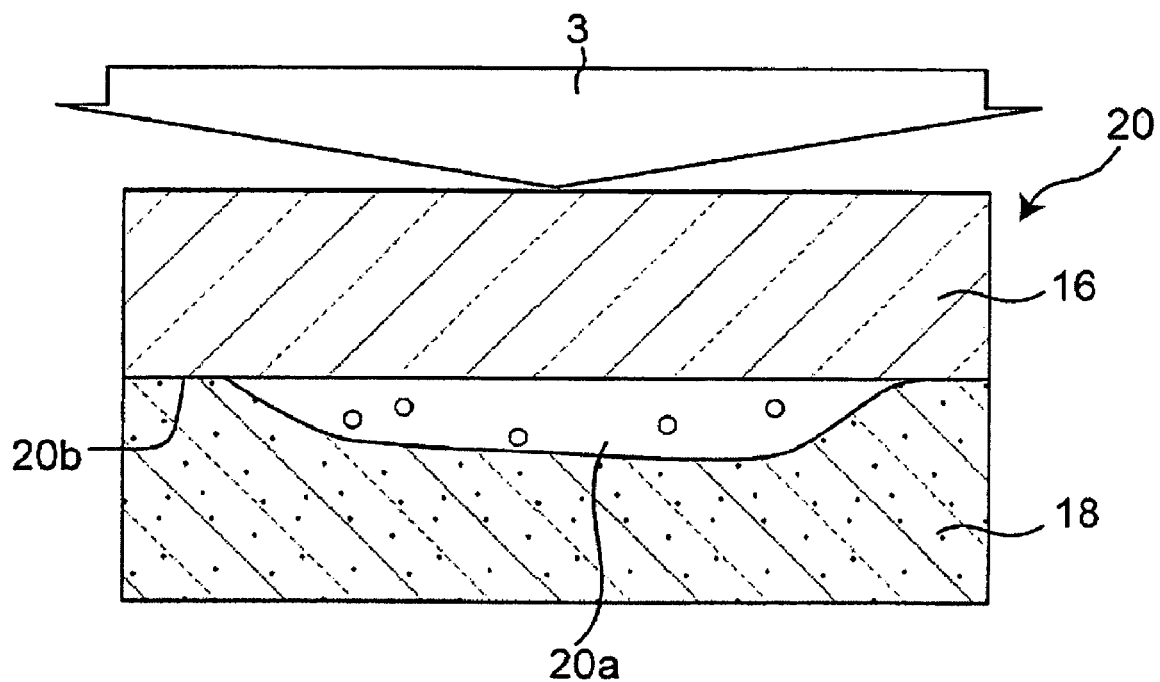
FIG. 4B is a sectional view schematically showing the state of interface between the disparate substrate and the nitride semiconductor layer being irradiated with laser beam in the atmosphere in a section perpendicular to the direction of scanning the laser beam.

FIG. 4A and FIG. 4B are sectional views schematically showing the state of the wafer 20 irradiated with the laser beam 3 in air atmosphere similarly to the prior art. FIG. 4A shows a section parallel to the direction of scanning the laser beam 3, and FIG. 4B shows a section perpendicular to the direction of scanning the laser beam 3. While thermal decomposition of the nitride semiconductor layer 18 proceeds in the vicinity of the interface with the disparate substrate 16 as the laser beam 3 scans, laser intensity is weaker near the peripheral portion of the wafer than at the middle portion of the wafer in the section perpendicular to the scanning direction of the laser beam, as shown in FIG. 4A and FIG. 4B. Therefore, as shown in FIG. 4B, while decomposition of the nitride semiconductor layer 18 proceeds in the middle portion 20a of the wafer, the nitride semiconductor layer 18 does not fully decompose or the metal produced by decomposition fuses the nitride semiconductor layer 18 and the disparate substrate 16 together near the peripheral portion 20b of the wafer. As a result, the disparate substrate 16 does not come off, and only the middle portion thereof is lifted. Nitrogen gas, that is a decomposition product, accumulates in a portion where decomposition of nitride semiconductor has proceeded. When the nitrogen gas escapes to the outside, it presses the nitride semiconductor layer 18 that is fused with the disparate substrate 16, thereby causing breakage of the nitride semiconductor layer 18. Since it is necessary to apply a mechanical stress to the disparate substrate 16 in order to remove the fused nitride semiconductor, this also leads to the breakage of the nitride semiconductor layer 18 and causes the fragment of the nitride semiconductor layer 18 that has come off to remain on the disparate substrate 16. While a case of scanning the laser beam that has linear beam shape has been described, similar problems can occur as long as the laser beam has an intensity distribution, also when the wafer is irradiated with laser beam over the entire surface thereof by other method.

In case the disparate substrate is removed by irradiating with the laser beam 3 in air atmosphere, the nitride semiconductor layer 18 decomposes into metal and nitrogen gas. Thus the decomposed metal remains near the surface of the nitride semiconductor layer 18, and the surface of the nitride semiconductor layer 18 does not become smooth after removal, resulting in much irregularities formed on the surface. Therefore, it has been necessary to smooth the surface after removal by CMP (chemical mechanical polishing) in order to carry on the device process.

In this embodiment, as shown in FIG. 1, the wafer 20 is irradiated with the laser beam 3 in an acidic or alkaline solution 10. Etching rate by the etching solution 10 is set to such a level as the etching rate is relatively low throughout the etching bath 8, so that surface condition and crystal quality of the bulk portion of the nitride semiconductor layer 18 are not affected. When irradiation with the laser beam 3 causes the disparate substrate 16 and the nitride semiconductor layer 18 to separate in the interface, the etching solution infiltrates the interface 17, where the nitride semiconductor layer 18 absorbs the energy and is locally heated to a high temperature, and many electron-hole pairs are excited by the laser beam 3. Therefore, etching rate of the nitride semiconductor layer 18 becomes very high. As a consequence, thermal decomposition due to the absorption of the laser beam 3 and chemical etching accelerated by the absorption of the laser beam 3 proceed at the same time in the interface 17, between the disparate substrate and the nitride semiconductor layer, that is irradiated with the laser beam 3, so that the disparate substrate 16 and the nitride semiconductor layer 18 can easily separate from each other even in a region that receives relatively low intensity of the laser beam. According to the removing method of this embodiment, the disparate substrate 16 can be removed uniformly over the entire surface regardless of the intensity distribution of the laser beam 3.

The wafer of the nitride semiconductor layer 18 (namely the nitride semiconductor wafer) obtained by removing the disparate substrate 16 according to this embodiment is characterized by the fact that the surface produced by the removal is as smooth as mirror surface. That is, since the region around the interface 17 that is irradiated with the laser beam 3 reaches a high temperature and many electron-positive holes are generated, the nitride semiconductor layer 18 is in such a state as easily etched. Moreover, since the nitride semiconductor layer 18 has been rich with metal due to the production of the metal through thermal decomposition of the nitride semiconductor near the interface 17, the nitride semiconductor layer 18 at the place has a composition that is easier to etch than that of the bulk portion. As a result, surface of the nitride semiconductor layer 18 formed after removal by the irradiation with the laser beam 3 in the etching solution 10 has become as smooth as a mirror surface, with surface roughness not larger than 10 nm. Surface roughness mentioned in this specification refers to a value measured with a scanning probe microscope (for example, SP13800 manufactured by SEIKO Inc.).

The nitride semiconductor wafer having such a smooth surface has such an advantage that it makes the subsequent formation of the device very easy. When forming an electrode on the nitride semiconductor layer after removing the disparate substrate therefrom, for example, good surface condition of the nitride semiconductor layer makes it easier to establish ohmic contact. In the case where gallium nitride that absorbs ultraviolet rays is removed from the nitride semiconductor layer from which the disparate substrate has been removed, it has been necessary to employ a mechanical means such as polishing in case the nitride semiconductor layer has surface irregularities in the prior art. According to this embodiment of the present invention, in contrast, since smooth surface of the nitride semiconductor layer is obtained, removal of the layer can be done by a simple method such as dry etching.

Ambient temperature during the irradiation with the laser beam 3, namely the temperature in the etching bath 8, may be either the room temperature or a high temperature to the extent that the etching solution 10 does not evaporate. There is no limitation to the etching solution as long as it has such acidity or alkalinity that is capable of etching at a proper rate to the nitride semiconductor layer 18. For example, KOH, sulfuric acid, phosphoric acid, hydrofluoric acid, pyrophosphoric acid or the like may be used. It is particularly preferable to use a strong alkali having pH value from 9 to 12, more preferably from 10 to 13. For example, KOH of concentration from 0.01 M to 10 M, preferably from 0.1 M to 1 M may be used. While the crystal growth wafer 20 is immersed in the etching solution 10 contained in the etching bath 8 in this embodiment, other method of supplying the etching solution 10 may also be employed as long as the etching solution 10 can be supplied to the interface 17 that is irradiated with the laser beam 3. For example, the etching solution 10 can be supplied to the interface between the disparate substrate and the nitride semiconductor layer by keeping the etching solution in an annular-shaped reservoir that surrounds the side face of the crystal growth wafer 20. The etching method described here can also be applied to the removal of the underlying layer as will be described in the fourth and fifth embodiments.

The wafer 20 from which the disparate substrate 16 is to be removed may be of any type as long as the nitride semiconductor layer 18 is formed on the disparate substrate 16 that is made of a material different from nitride semiconductor. The disparate substrate whereon the nitride semiconductor is grown may be an insulating substrate such as sapphire or spinel ($MgAl_2O_4$) that has the principal plane in either C plane, R plane or A plane, an oxide substrate that has matching lattice structure with the nitride semiconductor, SiC, Si or the like. Among these, sapphire and spinel are preferably used. The disparate substrate preferably has off-angle from the lattice plane such as C plane by 0.1 to 0.5 degrees, which enables it to improve the crystallinity of the nitride semiconductor layer.

When the interface between the disparate substrate and the nitride semiconductor layer is irradiated with the laser beam from the substrate side, namely the laser beam is caused to transmit the substrate, it is preferable to use sapphire, SiC, AlN or the like for the substrate. The AlN substrate may be made by separating AlN crystal grown on the disparate substrate such as sapphire. The removing method of the present invention may be employed when separating AlN crystal. For example, the AlN substrate may be made in the following process. After growing AlN crystal as the first nitride semiconductor layer on the disparate substrate such as sapphire, a second layer (for example, GaN crystal) having smaller band gap energy is formed on the first layer. Then the disparate substrate is separated by the removing method of the present invention, thereby to obtain a stack of nitride semiconductor layers that has the first layer and the second layer formed thereon. The AlN substrate is obtained by separating the first layer made of the AlN crystal from the stack of nitride semiconductor layers by the removing method of the present invention. The second layer made of GaN that remains at this time may have device structure formed thereon beforehand. Alternatively, the AlN substrate may also be obtained by removing the second layer by the method of removing the underlying layer to be described in the fourth embodiment.

While there is no limitation on the composition of the nitride semiconductor layer 18 as long as it is a single crystal of nitride semiconductor, it is preferably made of $Al_aIn_bGa_{1-a-b}N$ ($0 \leq a \leq 1$, $0 \leq b \leq 1$, $a+b \leq 1$), more preferably GaN. It is also preferable that the nitride semiconductor layer 18 is made of single crystal grown intervening a buffer layer that has been grown at a low temperature, either in a single layer or a multi-layered structure. The low-temperature growth buffer layer refers to a layer grown at a temperature lower than that of the nitride semiconductor layer that is a single crystal, for example, at a temperature roughly in a range from 400 to 800° C., and mitigates the lattice mismatch between the disparate substrate 16 and the nitride semiconductor layer 18. The nitride semiconductor layer 18 may also be formed by lateral growth to be described in the third embodiment. In order to remove the disparate substrate 16 from the crystal growth substrate 20, the wafer must have sufficient mechanical strength to support itself after the disparate substrate 16 has been removed therefrom. Accordingly, it is preferable to remove the disparate substrate 16 from the crystal growth wafer 20 after growing the nitride semiconductor layer 18 to a thickness of 100 μm or more, or after attaching a support substrate on the nitride semiconductor layer 18.

Figure 5:
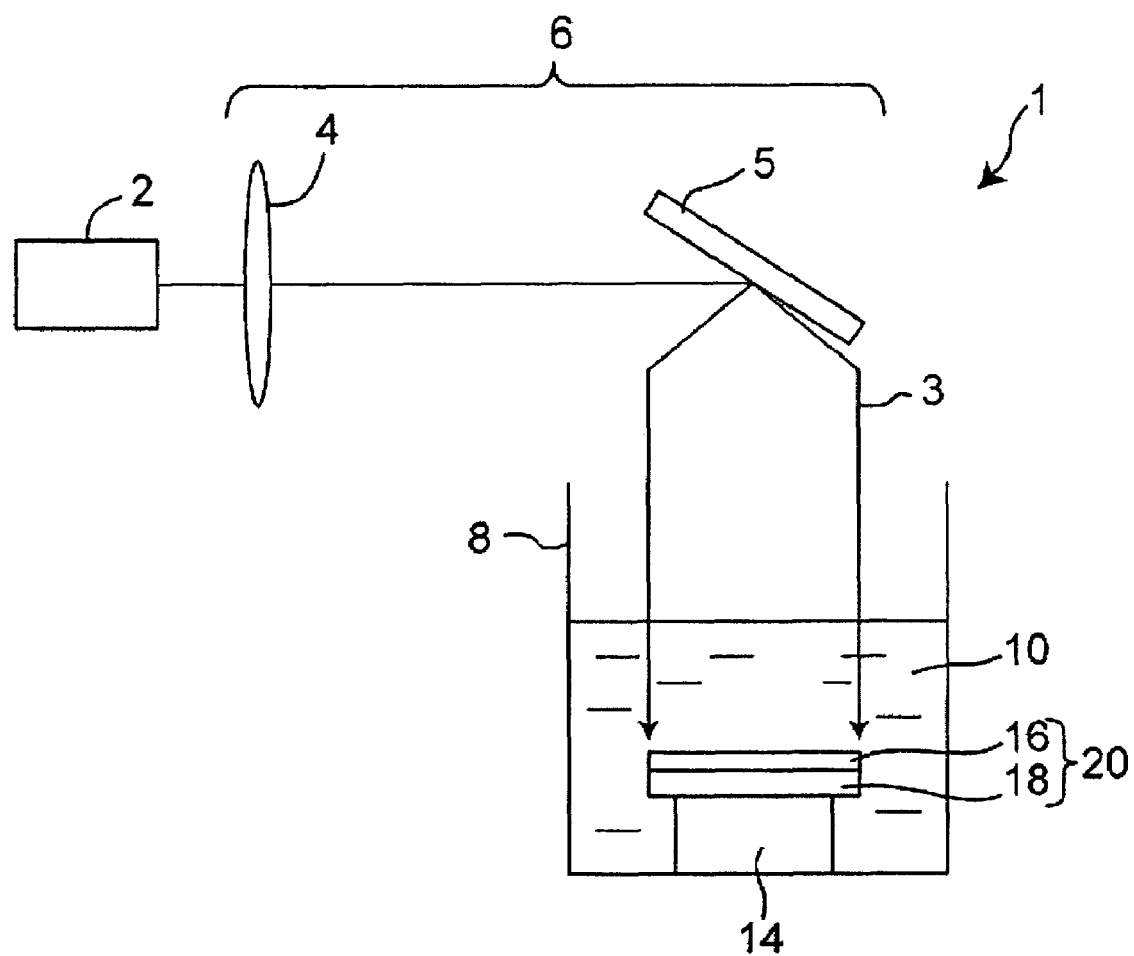
FIG. 5 is a schematic diagram showing a laser irradiation apparatus used in the first embodiment.

Now the laser irradiation apparatus used in removing the disparate substrate in this embodiment will be described below with reference to FIG. 5. The laser irradiation apparatus 1 shown in FIG. 5 comprises a laser source 2, an optical system 6 that conditions the laser beam emitted by the laser source 2 so as to irradiate the entire surface of the wafer 20, the etching bath 8 that contains the acidic or alkaline etching solution 10 and the holder 14 that holds the wafer 20.

The laser source 2 emits laser beam of a wavelength shorter than the band gap wavelength of the nitride semiconductor layer 18 from which the disparate substrate 16 is to be removed in the wafer 20. In case the nitride semiconductor layer 18 is made of GaN, for example, KrF eximer laser (wavelength 248 nm), YAG laser (quadrupled wavelength 266 nm) or Nd:YAG laser (wavelength 355 nm) may be used as the laser source 2.

The laser beam emitted by the laser source 2 is directed by the optical system 6 so as to irradiate the entire surface of the wafer 20 that is placed in the etching bath 8. The optical system 6 comprises, for example, a lens system 4 that transforms the laser beam into linear beam configuration, and a scanning lens 5 that one-dimensionally scans the laser beam in a direction perpendicular to the longitudinal direction of the beam over the wafer 20. There is no restriction on the optical system 6 as long as it can scan the laser beam over the entire surface of the wafer 20. For example, the optical system may be such that carries out two-dimensional scanning of substantially round beam. However, it is preferable to scan a beam of linear shape one-dimensionally since it enables it to sweep the entire surface of the wafer 20 in a shorter period of time and also makes it easier to cause the etching solution 10 to infiltrate the interface 17 between the disparate substrate and the nitride semiconductor layer.

The etching bath 8 contains the acidic or alkaline etching solution 10 so that at least one side of the wafer 20 is immersed therein. As decomposition of the nitride semiconductor layer 18 by the irradiation with the laser beam 3 proceeds, the etching solution 10 infiltrates into the interface with the disparate substrate 16. As a result, the laser irradiation apparatus 1 is capable of irradiating the entire surface of the wafer with the laser beam 3 while supplying the etching solution to the interface between the disparate substrate and the nitride semiconductor layer.

Embodiment 2

Now an embodiment where the present invention is applied to the manufacture of an UV light emitting diode or a UV laser as one kind of nitride semiconductor device will be described. A nitride semiconductor device can generally emit light with high internal quantum efficiency by forming a device layer on an underlying layer made of gallium nitride crystal that has been grown at a high temperature on a disparate substrate such as sapphire. In an UV light emitting diode or an UV laser, however, since gallium nitride of the underlying layer has a high absorptivity for ultraviolet rays, emission from the active layer is absorbed by the underlying layer itself, thus resulting in lower external quantum efficiency. For this reason, it has been proposed to, after attaching a support substrate made of Cu—W or the like on the top surface of the wafer on which the device layer has been formed, remove the disparate substrate and further remove the gallium nitride layer that is the underlying layer. Removal of the disparate substrate is carried out by irradiating with laser beam while supplying the etching solution to the interface.

Figure 6A:
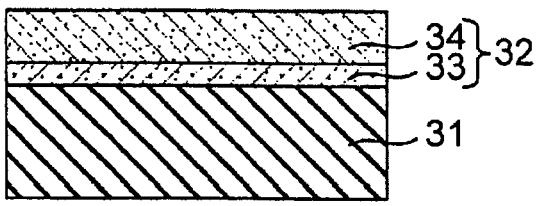
FIGS. 6A through 6F are process diagrams showing a method of manufacturing a nitride semiconductor device according to a second embodiment.
Figure 6B:
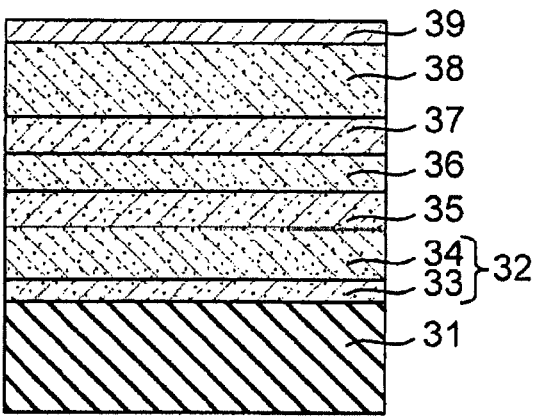
Figure 6C:
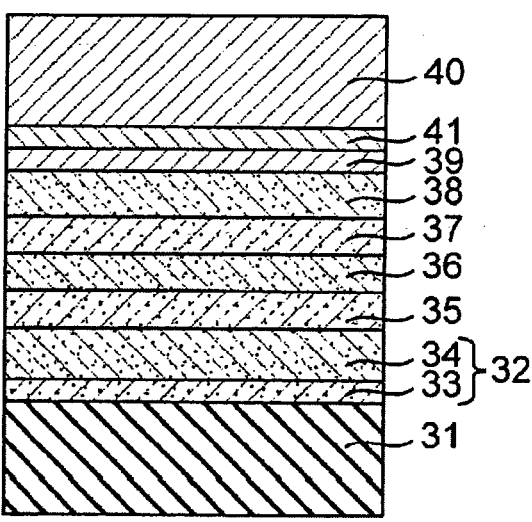

FIGS. 6A through 6F are schematic sectional views showing the method of manufacturing a nitride semiconductor light emitting device of this embodiment. An underlying layer 32 comprising a buffer layer 33 and a high temperature growth layer 34 is formed on the surface of the disparate substrate 31 (FIG. 6A). Then, an n-type cladding layer 35, an active layer 36, a p-type cladding layer 37, a p-type contact layer 38 and a first junction layer 39 comprising one or more metal layer is formed on the underlying layer 32 (FIG. 6B). As a part of the first junction layer 39, after forming a p electrode on the p-type contact layer 38, annealing treatment is applied so as to obtain ohmic contact. Then a support substrate 40 having a second junction layer 41 that is constituted from one or more metal layer formed on the surface thereof is placed on the disparate substrate 1 so that the first junction layer 39 and the second junction layer 41 oppose each other, and is heated under a pressure so as to bond.

Figure 6D:
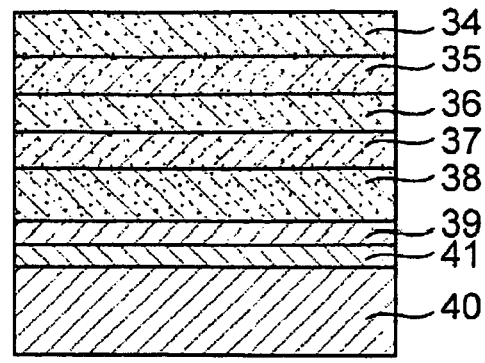

The disparate substrate 31, which was joined to the electrically conductive support substrate 40, is removed in a manner similar to the first embodiment (FIG. 6D). Specifically, the disparate substrate 31 is removed by a laser irradiation on the wafer over the entire surface thereof from the disparate substrate 31 side in an acidic or alkaline solution. After removing the disparate substrate 31, the buffer layer 33 is removed through thermal decomposition by the laser beam and etching by the etching solution, thereby to expose the high temperature growth layer 34.

Figure 6E:
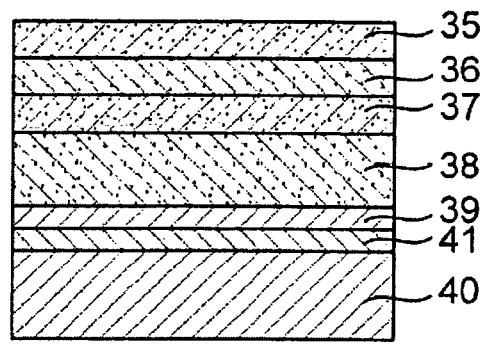

Then the high temperature growth layer 34 is removed so as to expose the n-type cladding layer 35 (FIG. 6E). At this time, in the prior art, a method such as CMP or the like has been required since the high temperature growth layer 34 has irregular surface. In this embodiment, in contrast, the high temperature growth layer 34 can be removed by dry etching or the like since the surface of the high temperature growth layer 34 that is exposed by removal is as smooth as a mirror surface. When a method such as dry etching can be employed, it is advantageous since it makes it possible to form electrodes with better ohmic contact with lower $V_f$. Also in order to improve the efficiency of extracting light, treatment such as RIE may be applied to the exposed surface of the n-type nitride semiconductor layer that would become the light extracting surface so as to make irregular surface. The surface irregularity may have such shape as mesa or inverted mesa in the sectional view and island, grid, rectangular, circular or polygonal in the plan view. The surface of a transparent protective film that covers the nitride semiconductor device may also be made irregular.

Figure 6F:
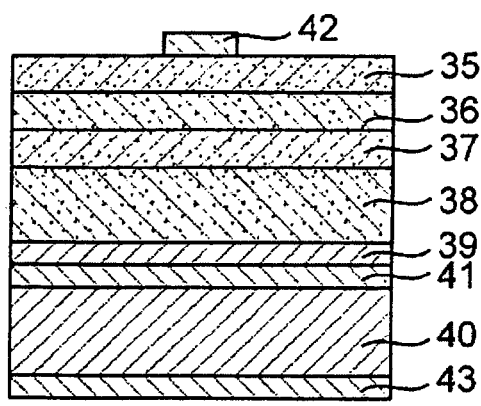

After polishing the surface of the n-type cladding layer 35 that has been exposed, the n electrode 42 is formed on the n-type cladding layer 35 and a pad electrode 43 for the p electrode is formed over the entire surface of the support substrate 40. Then the wafer is diced into chips of light emitting device. Thus the light emitting device having the nitride semiconductor layer stacked on the support substrate with the electrodes formed on the support substrate is obtained (FIG. 6F).

The disparate substrate of this embodiment is similar to that of the first embodiment. In case the nitride semiconductor layer is formed on the disparate substrate, nitride semiconductor having improved crystallinity can be obtained by employing ELOG (epitaxially lateral overgrowth) process to be described in relation to the third embodiment. When the ELOG process is employed, the following method may be used instead of the process shown in FIGS. 6A through 6D. First, after forming an underlying layer from nitride semiconductor on the disparate substrate, the underlying layer is partially etched down to the disparate substrate so as to form an irregular surface. Then a lateral growth layer is formed by the ELOG process on the irregular surface of the underlying layer. After forming an n-type nitride semiconductor layer, an active layer and a p-type nitride semiconductor layer successively on the lateral growth layer, a support substrate is joined on the p-type nitride semiconductor layer. Then the entire surface of the disparate substrate is irradiated with the laser beam in the etching solution, so as to remove the disparate substrate through decomposition and etching of the underlying layer. With this method, since voids are formed between the irregular surface and the lateral growth layer, nitrogen gas generated through decomposition of the nitride semiconductor spreads in the voids so as to prevent the nitride semiconductor layer from being destroyed by the nitrogen gas pressure, while at the same time making it easier for the etching solution to infiltrate due to the voids so that removal of the disparate substrate proceeds more smoothly.

For the disparate substrate, a substrate of which principal plane has off angled or preferably a substrate having stepwise off angle is used. When a substrate having an offset angle is used, three-dimensional growth does not occur on the surface and the surface tends to be smoother due to stepwise growth. Moreover, it is preferable that the direction along the terrace of the sapphire substrate that has stepwise offset angle (step direction) is perpendicular to the A plane of sapphire, since in this case the step surface of the nitride semiconductor agrees with the direction of the laser resonator so that random reflection of the laser beam by a rough surface is mitigated.

It is also preferable that the support substrate is made of an electrically conductive material, and may be made of a semiconductor such as Si or SiC, a single metal or a composite metal consisting of two or more metals that do not form a solid solution or have a low value of solid solubility limit. Among these, it is preferable to use a substrate made of a composite metal consisting of two or more metals. Metallic substrates have better mechanical properties than semiconductor substrates and can easily undergo elastic deformation or plastic deformation, and are less likely to break. The metallic substrate may be made of one or more kind of metal selected from a group of highly conductive metals such as Ag, Cu, Au and Pt and one or more kind of metal selected from a group of high hardness metals such as W, Mo, Cr and Ni. The metallic substrate is preferably made of a composite metal such as Cu—W or Cu—Mo, which is advantageous because it includes Cu that has high heat conductivity and therefore shows high heat dissipation. In the case of the composite material Cu—W, proportion x of Cu is preferably in a range of $0<x\leqq30\%$ by weight. In the case of the composite material Cu—Mo, proportion x of Cu is preferably in a range of $0<x\leqq50\%$ by weight. A composite of a metal and ceramic such as Cu-diamond may also be used. Thickness of the support substrate is preferably in a range from 50 to 500 μm in order to improve heat dissipation.

The material of the support substrate is preferably selected so that thermal expansion coefficients A, B and C of the disparate substrate for crystal growth, the nitride semiconductor layer and the support substrate, respectively, satisfy a relation of $A\geqq C>B$. In case the support substrate is made of a composite metal, a desired value of thermal expansion coefficient can be obtained by controlling the proportions of the component elements of the composite metal. Now consider a case of constituting the support substrate from a composite metal of Cu and Mo. Cu has thermal expansion coefficient of about $16\times10^{-6}$ K$^{-1}$, and Mo has thermal expansion coefficient of about $5\times10^{-6}$ K$^{-1}$. Therefore, thermal expansion coefficient of the support substrate can be made low by decreasing the proportion of Cu in the composite material and can be made high by increasing the proportion of Cu. In this way, the disparate substrate can be lifted by the stress caused by the difference in thermal expansion coefficient, thus making it easier to remove the disparate substrate when it is irradiated with the laser beam in the etching solution.

The underlying layer 32 may be constituted from at least one layer of nitride semiconductor, but is preferably constituted from the buffer layer 33 that is grown on the disparate substrate 31 at a low temperature and the high temperature growth layer 34 that is grown on the buffer layer 33 at a high temperature.

The buffer layer 33 is made of nitride semiconductor $Ga_iAl_{1-i}N$ ($0<i\leqq1$) that preferably has a low proportion of Al, and more preferably made of GaN. This improves the crystallinity of the nitride semiconductor layer that is grown on the buffer layer. Thickness of the buffer layer is preferably in a range from 0.002 to 0.5 μm, more preferably from 0.005 to 0.2 μm, and most preferably from 0.01 to 0.02 μm. Growth temperature of the buffer layer is preferably in a range from 200 to 900° C., and more preferably from 400 to 800° C.

The high temperature growth layer 34 is preferably made of undoped GaN or GaN doped with an n-type impurity. Thickness of the high temperature growth layer is preferably 500 Å or more, more preferably 5 μm or more and most preferably 10 μm or more. Growth temperature of the high temperature growth layer is preferably in a range from 900 to 1100° C., and preferably from 1050° C. or higher.

When removing the underlying layer in this embodiment, it is not necessary to completely remove the underlying layer and it is sufficient to partially remove the underlying layer to such an extent that absorption of the emitted light by the layer can be suppressed sufficiently. In the example described above, absorption by the layer can be suppressed sufficiently by, for example, decreasing the thickness of the GaN layer that absorbs the emitted light to 0.1 μm, preferably to 0.01 μm. When thickness of the GaN layer is decreased to 0.1 μm or less, about 70% or more of the light emitted can be extracted and, when the thickness is decreased to 0.01 µm or less, 96% or more of the light emitted can be extracted. In the fourth embodiment to be described later, the underlying layer (first crystal layer) can be selectively removed in a satisfactory manner.

The underlying layer is not limited to a constitution that includes GaN, but any constitution that improves the crystallinity of the n-type nitride semiconductor layer that is grown thereon may be employed. In case the underlying layer includes nitride semiconductor that absorbs light emitted by the active layer, the efficiency of extracting light can be improved by removing the underlying layer. For example, even a layer that is made of GaN and includes small amount of (for example, 1% or less) In and/or Al, it has an effect of improving the crystallilnity, if the content of In and/or Al is sufficiently lower than that of a layer to be formed thereon. By removing the crystal growth substrate and the underlying layer after forming the device structure over such an underlying layer as described above, it is made possible to suppress the self absorption of the emitted light in the device, while maintaining good crystallinity of the nitride semiconductor that constitutes the device.

The nitride semiconductor that absorbs light emitted by the active layer is a nitride semiconductor itself that has such a band gap energy so proximate to the wavelength emitted by the active layer that absorption of light by the nitride semiconductor cannot be deemed negligible. For example, the nitride semiconductor can absorb light emitted by the active layer, if the nitride semiconductor has a band gap energy (BGE) that is less than a critical value calculated as the energy of the peak emission (PE) plus 0.1 eV as shown below.

$$(BGE \text{ of nitride semiconductor that absorbs light}) \leq (PE + 0.1 \text{ eV})$$

The active layer preferably has multiple quantum well structure with $In_xGa_{1-x}N$ ($0 \leq x < 1$) included in the well layer. In view of crystallinity, mole fraction x of In is preferably 0.2 or less, more preferably 0.1 or less. Wavelength of the emission by the active layer is preferably 365 nm or longer and not longer than 420 nm (more preferably not longer than 410 nm).

Relationship between the band gap energy and the composition of the nitride semiconductor may be assumed such that the bowing parameter has a value of 1. For example, band gap energy of the nitride semiconductor made of ternary alloy $A_{1-x}B_xC$ can be expressed in terms of the band gap energies of binary mixed crystals AC and BC, $EG_{AC}$ and $EG_{BC}$, respectively, as follows:

$$EG(A_{1-x}B_xC) = (1-x)EG_{AC} + xEG_{BC} - (1-x)x$$

Embodiment 3

Described in this embodiment is an example of manufacturing the nitride semiconductor wafer by a lateral growth process known as the ELOG (epitaxially lateral overgrowth). After forming the nitride semiconductor layer on the disparate substrate by the lateral growth process, the disparate substrate is removed by the method of the present invention, thereby to obtain the nitride semiconductor wafer that is made of the nitride semiconductor only.

A typical process of lateral growth is one that uses a protective film. For example, a disparate substrate or a nitride semiconductor layer grown thereon is partially covered by a protective film provided thereon. Then the nitride semiconductor is grown through an opening (non-masked region) of the protective film preferentially over the protected portion, or preferably selectively. As patches of the nitride semiconductor that have grown cover the protected portions and coalesce with each other, a film of the nitride semiconductor is formed. The protective film is made of a material that allows the nitride semiconductor to grown selectively or preferentially. For example, the protective film may be made of $SiO_2$ since nitride semiconductor does not grow directly on $SiO_2$.

Besides the above, the following methods may also be employed: (a) to form islands of the nitride semiconductor on the disparate substrate and grow the nitride semiconductor laterally using the islands as the nucleus; (b) to form protrusions and recesses in the surface of the nitride semiconductor located on the disparate substrate or in the surface of the disparate substrate, and grow the nitride semiconductor laterally using the protrusions as the starting points; and (c) to create facets of the nitride semiconductor crystal and let facet growth proceed. The nitride semiconductor can be grown in layer configuration as the patches of nitride semiconductor growing laterally from the starting points coalesce with each other, by smoothing out the surface irregularities.

When the lateral growth process is employed, voids may be formed in the wafer. Specifically, there may such voids as follows:

(1) A Case of Lateral Growth Using Protective Film

Voids are formed between the nitride semiconductor that has grown laterally and the protective film, in the case of lateral growth using a protective film. Specifically, voids that are formed between the nitride semiconductor and the protective film below the meeting and coalesced portions of the lateral growth.

(2) A Case of Lateral Growth Using Islands

Voids are formed below the meeting and coalesced portions of the lateral growth when the gaps between the islands are filled in.

(3) A Case of Lateral Growth Using Protrusions

Voids are formed in recesses when the recesses between the protrusions are filled by the nitride semiconductor.

In case the disparate substrate is removed by the method of the present invention after forming the nitride semiconductor layer on the disparate substrate by lateral growth, it is made easier for the etching solution to infiltrate due to the voids and the protective film. Consequently, the lift off of the disparate substrate is facilitated. Thus occurrence of defects can be reduced when removing the disparate substrate, resulting in higher yield. While infiltration of the etching solution can be improved when either the voids or the protective film is provided, it is preferable that both are provided.

Embodiment 4

Described in this embodiment is a method of efficiently removing a part of the nitride semiconductor layer, instead of removing the disparate substrate. In this embodiment, part of the nitride semiconductor layer is removed from a stack of nitride semiconductor layers that have different band gap energy, by etching with an acidic or alkaline etching solution while irradiating with light of a wavelength that is selectively absorbed by the nitride semiconductor layer to be removed. This increases the difference in the etching rate of the nitride semiconductor to be removed, while the surface made by removal becomes smoother. This method can be used, for example, for efficiently removing the underlying layer 32 described in the first embodiment from the device structure of nitride semiconductor formed thereon.

Figure 8A:
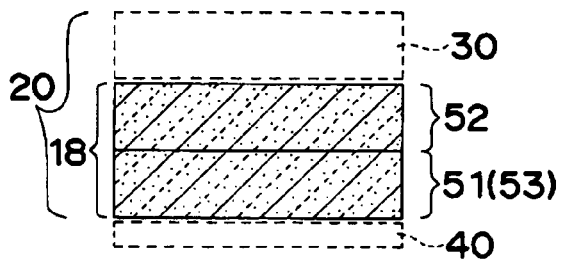
FIGS. 8A through 8E are schematic sectional views showing a part of step to remove a second crystal layer in a fourth embodiment.

FIGS. 8A through 8F are schematic diagrams showing the lifting off method of this embodiment. As shown in FIG. 8A, the wafer 20 is prepared that has a first crystal layer 52 of nitride semiconductor and a second crystal layer 51 of nitride semiconductor grown on a disparate substrate 30. The first crystal layer 52 is made of a nitride semiconductor that has lower band gap energy than that of the first crystal layer 51. For example, the first crystal layer is made of $Al_xGa_{1-x}N$ ($0 \leq x < 1$) and the second crystal layer is made of $Al_yGa_{1-y}N$ ($0 < y \leq 1$, $x < y$). The second crystal layer 51 may include a device structure 53 formed therein. Relation between the band gap energy levels of the first crystal layer 52 and the second crystal layer 51 in case the device structure 53 is provided will be described later. The disparate substrate 30 is removed from the wafer 20 to obtain the nitride semiconductor wafer 18. At this time, the nitride semiconductor wafer 18 may be fastened on the support substrate 40 described in the first embodiment. From the nitride semiconductor wafer 18, only the first crystal layer 52 is selectively removed.

Figure 8B:
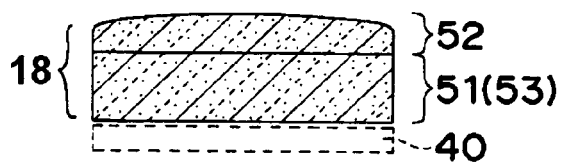

It is preferable to polish the first crystal layer 52 as shown in FIG. 8B. Since etching by means of acid or alkali has a lower rate of removal than a mechanical process, productivity can be improved by polishing the first crystal layer 52 and reducing the thickness thereof in advance. Since this results in a shorter period of etching by means of acid or alkali, it also provides an advantage that the second crystal layer 51 can be prevented from being damaged. For example, there may be such a case where the first crystal layer 52 includes a layer that has lower band gap energy than the second crystal layer 51, in which case the layer is likely to be damaged by dissolution during etching. Such damage can be reduced by reducing the duration of etching.

The disparate substrate 30 and the nitride semiconductor layer 18 usually have differences in the lattice constant and in thermal expansion coefficient. As a result, the nitride semiconductor wafer 18 often warps after the disparate substrate 30 has been removed. When the nitride semiconductor wafer 18 that has warped is polished or etched in the usual way, the polished or etched surface tends to become a curved surface according to the warping as shown in FIG. 8B. Even when the polished or etched surface remains flat, orientation of the crystal tends to be inclined in accordance to the warping. In this specification, these phenomena will be collectively referred to as the curving of surface by warping. In the example shown in FIG. 8B, polishing of the surface of the first crystal layer 52 on which the disparate substrate 30 was provided resulted in convex shape of the polished surface. When the nitride semiconductor wafer 18 in this condition is used, it is difficult to grow a crystallographically flat nitride semiconductor layer thereon. The expression "crystallographically flat" means that the surface is flat and the crystal has a better axial orientation.

Figure 8C:
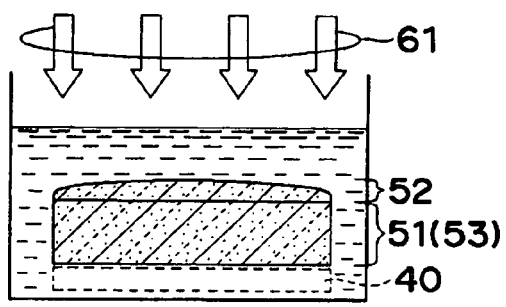

Accordingly, in this embodiment, as shown in FIG. 8C, the nitride semiconductor wafer 18 is irradiated with an excitation light 61 while being immersed in an etching bath. The etching solution contained in the etching bath may be similar to that of the first embodiment. Wavelength of the excitation light 61 is preferably shorter than the band gap wavelength of the first crystal layer 52 to be removed. More preferably, wavelength of the excitation light 61 is made shorter than the band gap wavelength of the first crystal layer 52 and longer than the band gap wavelength of the second crystal layer 51. The meaning of the band gap energy wavelengths of the first crystal layer 52 and the second crystal layer 51 is similar to that described in the first embodiment. Since the first crystal layer 52 has lower band gap energy than the second crystal layer 51 has, it selectively or preferentially absorbs the excitation light 61. As a result, the first crystal layer 52 is dissolved preferentially over the second crystal layer 51.

Figure 8D:
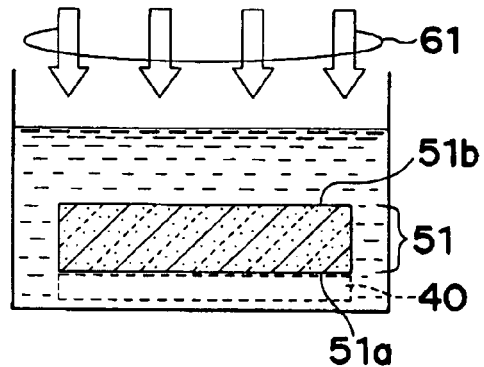
Figure 8E:
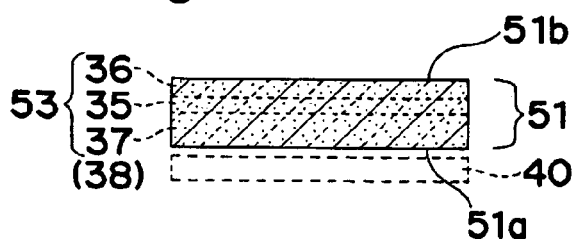

When the first crystal layer 52 is removed, the nitride semiconductor wafer comprising the second crystal layer 51 is obtained as shown in FIG. 8D. With a difference in the etching rate between the first crystal layer 52 and the second crystal layer 51 in the etching process using the excitation by light, a flat surface 51b having less irregularities is obtained by stopping the progress of etching at the interface of crystals. The second crystal layer 51 functions as an etching stop layer.

An experiment was conducted as follows to check the selectivity of etching. First, a wafer (GaN wafer) comprising a GaN crystal layer grown to a thickness of 4 µm on a sapphire substrate, and a wafer (AlGaN wafer) comprising $Al_yGa_{1-y}N$ ($y=0.07$) crystal layer grown to a thickness of 4 µm on a sapphire substrate were prepared. The two kinds of wafer were immersed in an etching bath of KOH (0.1 [mol/L], about 13 in pH value, room temperature), and were irradiated with excitation light of wavelength from 365 to 400 nm for about 4 minutes. An ultra-high pressure mercury lamp emitting in a wavelength range from 300 to 400 nm fitted with a filter cutting off wavelengths shorter than 365 nm was used as the excitation light source. Mean depth of etching determined from measurements at a plurality of points of the wafer was as follows. Mean depths of etching (µm) of the GaN with and without the excitation light were 0.325 and 0.062, respectively. Mean depths of etching (µm) of the AlGaN with and without the excitation light were 0.108 and 0.144, respectively. This result shows that sufficient difference in the etching rate can be ensured between the crystal layers having different band gap energy. Therefore, the first crystal layer 52 can be selectively removed by forming the first crystal layer 52 from GaN and the second crystal layer 51 from AlGaN. The difference in the etching rate between the first crystal layer 52 and the second crystal layer 51 also enables it to stop the etching process at the interface between both layers. As a result, surface of the second crystal layer 51 after the first crystal layer 52 is removed can be made crystallographically flat by properly controlling the conditions. Such a surface is preferable as the crystal growth surface.

When the first crystal layer is made of $Al_xGa_{1-x}N$ ($0 \leq x < 1$) and the second crystal layer is made of $Al_yGa_{1-y}N$ ($0 < y \leq 1$, $x < y$), the difference in the mole fraction of Al ($y-x$) is preferably 0.05 or higher, and more preferably 0.1 or higher, which results in greater difference in the etching rate. It is preferable to form the first crystal layer 52 from $Al_xGa_{1-x}N$ ($0 \leq x < 0.3$) and the second crystal layer 51 from $Al_yGa_{1-y}N$ ($0.05 \leq y \leq 1$). More preferably, mole fractions of Al in the first crystal layer 52 and the second crystal layer 51 are set such that $0 \leq x < 0.1$ and $0.1 \leq y \leq 1$. This constitution makes it possible to grow the first crystal layer 52 and the second crystal layer 51 with better crystallinity and satisfactorily remove the first crystal layer 52.

As described previously, the second crystal layer 51 may have the device structure 53. The device structure 53 may have such layer structures 35 through 37 as described later in Examples. In case the second crystal layer 51 consists of a plurality of layers, it suffices that the band gap energy of the first crystal layer 52 is larger than the band gap energy of the layer of the second crystal layer 51 that is located nearest to the first crystal layer 52, namely the layer that makes contact with the first crystal layer 52. Provided that this condition is satisfied, some of the layers that constitute the second crystal layer 51 may have a band gap energy lower than that of the first crystal layer 52. It is necessary to provide, between a layer having a band gap energy lower than that of the first crystal layer 52 and the first crystal layer 52, a nitride semiconductor layer that has a band gap energy higher than that of the first crystal layer 52. For example, in Example 1 to be described later, the underlying layer 32 corresponds to the first crystal layer 52 and the n-type AlGaN cladding layer 35 corresponds to the layer that is in contact with the first crystal layer 52. In this case, a layer (for example the active layer 36) located far away from the underlying layer 32 than the n-type AlGaN cladding layer 35 may have a band gap energy lower than that of the underlying layer 32. In this constitution, the layer (for example the active layer 36) having a lower band gap energy is protected by the n-type AlGaN cladding layer 35 having a higher band gap energy. In case the layer that has lower band gap energy is dissolved in the etching solution, exposed surface of the layer that has lower band gap energy may be protected with a masking member during the etching process.

Figure 9:
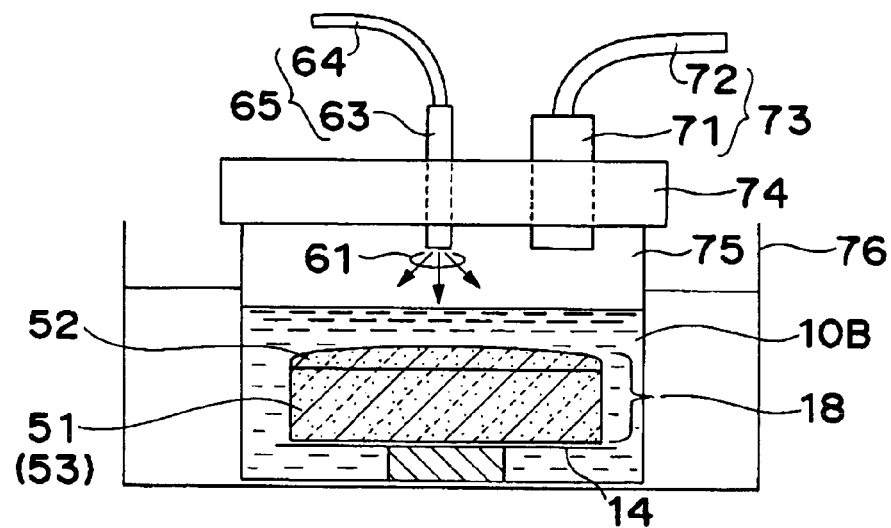
FIG. 9 is a schematic diagram showing a crystal dissolving apparatus used in the fourth embodiment.

FIG. 9 schematically shows an example of etching apparatus used in this embodiment. An etching solution 10B contained in an etching tank 75 is covered by a shield case 76 that shuts off outside light. The wafer 18 is placed on the holder 14 that is installed in the etching solution 10B. The etching tank 75 is covered with a cap 74 on the top so as to shut off outside light. Excitation light 61 emitted by the excitation light source is introduced through a guide member 64 such as optical fiber into the etching tank 75. Distal end of the guide member 64 is fixed onto the cap 74 by means of a clamp member 63. The etching process can be monitored by installing a monitor 71 and communication means 72. This makes use of the fact that the first and second crystal layers 52, 51 are observed with different colors when illuminated with the excitation light 61. Disappearance of the color of the first crystal layer 52 indicates that the first crystal layer 52 has been completely removed. Accordingly etching is terminated at this time, and the wafer may be taken out of the etching solution 10B. As shown in FIG. 9, it is preferable to irradiate the wafer 18 with the excitation light 61 on the principal plane on the side of the first crystal layer 52. A constitution other than that shown in FIG. 9 may also be employed as long as at least a part of exposed portion of the first crystal layer 52 is supplied with the etching solution 10B and is irradiated with the excitation light 61.

The method of removing the nitride semiconductor of this embodiment can also be applied to the removal of the underlying layer 32 that is unnecessary in the device structure, for the nitride semiconductor wafer 18 that is separated from the disparate substrate in the first through third embodiments. The method can also be applied to the removal of residue from the surface of the nitride semiconductor wafer 18 from which the disparate substrate has been removed, or to the surface treatment to smooth out the irregularities of the surface after removal. The method can also be applied to the nitride semiconductor layer that has been separated from the disparate substrate by polishing or the like, not by the use of laser light. It is particularly applied preferably to a nitride semiconductor wafer where thickness of the first crystal layer (distance from the interface between the first crystal layer and the second crystal layer to the surface of the first crystal layer) varies within the surface. It may also be applied preferably to wafer that has curved surface due to warping.

Embodiment 5

Described in this embodiment is a case where light emitted by the device structure within the wafer is used as the excitation light 61 of the fourth embodiment. The method of removing the nitride semiconductor layer described in the fourth embodiment may not be laser ablation, unlike the methods of removing the disparate substrate described in the first through third embodiments. Accordingly, light from an LED or the like, instead of laser, may be used as the excitation light 61. It is preferable that wavelength or range of wavelengths of the excitation light 61 is limited. The excitation light 61 is preferably monochromatic light of narrow wavelength region or has a spectrum of sharp peak. The excitation light may be emitted by, for example, by an LED or a high pressure mercury lamp. Under the light emitted by such sources, crystals that have different band gap energy levels show different body colors or fluorescent colors. Accordingly, the etching process and the polishing process can be controlled by observing the color.

Figure 10A:
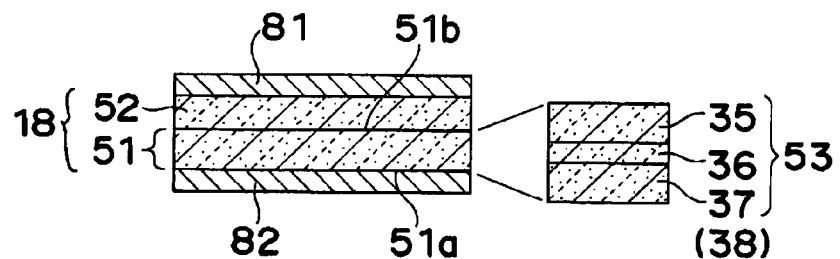
FIG. 10A is a schematic sectional view showing a part of the step to remove the second crystal layer in a fifth embodiment.

A case of using an LED as the excitation light source will be described below with reference to FIG. 10A and FIG. 10B. As shown in FIG. 10A, the LED device structure 53 that includes the n-type cladding layer 35, the active layer 36 and the p-type cladding layer 37 is formed in the second crystal layer 51. Light emitted by the LED device structure 53 is used as the excitation light 61. Since the LED device has an emission spectrum that is broader than that of laser, it is not necessary to make the wavelength of peak emission shorter than the band gap wavelength of the first crystal layer 52. It suffices that the emission spectrum of the LED device 53 includes a significant proportion of light of wavelengths shorter than the band gap wavelength of the first crystal layer 52. It is preferable that the wavelength of emission from the LED device structure 53 is shorter than the band gap wavelength that corresponds to the band gap energy E of the first crystal layer 52 plus 0.1 eV (E+0.1 eV). The emission wavelength here refers to the wavelength of the peak of the emission spectrum. Emission wavelength of the LED is preferably in a range from 365 nm to 420 nm (more preferably not longer than 410 nm). As shown in FIG. 10A, electrodes 81, 82 that can supply electricity to the LED device structure 53 are provided on the top and bottom surfaces of the nitride semiconductor wafer. In FIG. 10A, the electrode 82 is formed on a surface 51a of the second crystal layer 51 that is located opposite to the first crystal layer 52, and the electrode 81 is formed on a surface of the first crystal layer 52 that is located opposite to the second crystal layer 51.

Figure 10B:
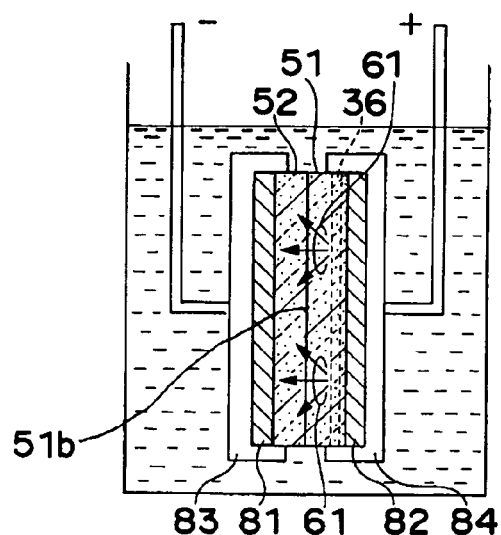
FIG. 10B is a schematic sectional view showing a part of the step to remove the second crystal layer in the fifth embodiment.

Then as shown in FIG. 10B, the nitride semiconductor wafer 18 is covered with covering members 83 and 84 so that at least an interface 51b between the first crystal layer and the second crystal layer and a part of the first crystal layer 52 are exposed. The covering members 83 and 84 also serve as external electrodes for supplying electricity to the electrodes 81, 82. The nitride semiconductor wafer 18 is immersed in the etching bath and the LED device 53 is caused to emit light by energizing it through the electrodes 81 and 82 while exposing the exposed surface to the etching solution. Light emitted by the LED device 53 serves as the excitation light 61. As light emitted by the LED device 53 is absorbed by the first crystal layer 52, etching rate of the first crystal layer 52 becomes higher, so that the first crystal layer 52 is selectively or preferentially etched. In such a case as this embodiment, the active layer 36 in the LED device 53 tends to be damaged by the etching solution. Therefore, it is preferable to cover with the covering member 84 so that the active layer 36 is not exposed to the etching solution.

EXAMPLE 1

The nitride semiconductor device shown in FIG. 6A through 6F was made by the following procedure.

(Disparate Substrate 31)

A substrate made of sapphire (plane C) was used as the disparate substrate 31 for growing the semiconductor, and the surface was cleaned at 1050° C. in hydrogen atmosphere in a MOCVD reactor.

(Underlying Layer 32)

Buffer layer 33: The buffer layer 33 made of GaN was grown on the substrate to thickness of about 200 Å using ammonia and TMG (trimethyl aluminum) at 510° C. in hydrogen atmosphere.

High temperature growth layer 34: After growing the buffer layer 33, supply of only TMG was stopped and temperature was raised to 1050° C. At 1050° C., high temperature growth nitride semiconductor layer 34 made of undoped GaN was grown to a thickness of 5 μm by using TMG and ammonia as the stock materials.

(n-Type Cladding Layer)

Then with the temperature set to 1050° C., TMG, TMA, ammonia and silane were used to grow the n-type cladding layer 35 made of $Al_{0.18}Ga_{0.82}N$ doped with $5\times10^{17}/cm^3$ of Si to thickness of 400 Å.

(Active Layer 36)

With the temperature set to 800° C., TMI (trimethyl indium), TMG and TMA were used as the stock material to grow the barrier layer made of Si-doped $Al_{0.1}Ga_{0.9}N$ and a well layer made of undoped $In_{0.03}Al_{0.02}Ga_{0.95}N$ was formed thereon, repeating this process to form a stack of barrier layer (1)/well layer (1)/barrier layer (2)/well layer (2)/barrier layer (3). Thickness was set to 200 Å for the barrier layer (1), 40 Å for the barrier layers (2), (3) and 70 Å for the well layers (1), (2). Thus the active layer of multiple quantum well structure (MQW) having total thickness of about 420 Å was formed.

(p-Type Cladding Layer 37)

Then the p-type cladding layer 37 was formed from $Al_{0.2}Ga_{0.8}N$ doped with $1\times10^{20}/cm^3$ of Mg to a thickness of 600 Å, using TMG, TMA, ammonia and $Cp_2Mg$ (cyclopentadienyl magnesium) at 1050° C. in hydrogen atmosphere.

(p-Type Contact Layer 38)

Then a first p-type contact layer was formed on the p-type cladding layer 37 from $Al_{0.04}Ga_{0.96}N$ doped with $1\times10^{19}/cm^3$ of Mg to a thickness of 0.1 μm by using TMG, TMA, ammonia and $Cp_2Mg$. Then, with the gas flow rate being adjusted, a second p-type contact layer was formed from $Al_{0.01}Ga_{0.99}N$ doped with $2\times10^{21}/cm^3$ of Mg to a thickness of 0.02 μm. After growing the layers, the wafer was annealed at 700° C. in the reactor, so as to decrease the resistance of the p-type layers further.

(First Junction Layer 39)

After annealing, the wafer was taken out of the reactor and an Rh film having thickness of 2000 Å was formed as p electrode on the p-type contact layer, followed by ohmic anneal at 600° C. Then an insulating protective $SiO_2$ film was formed on the exposed surface except for the p electrode to a thickness of 0.3 μm.

Then a multi-layer film of Ni—Pt—Au—Sn—Au was formed on the p electrode with thickness of 2000 Å-3000 Å-3000 Å-30000 Å-1000 Å, respectively. Ni was used as bonding layer, Pt as barrier layer, Sn as first eutectic-forming layer and Au located between Pt and Sn for preventing Sn from diffusing into the barrier layer. The outermost Au layer improves bonding with the second eutectic-forming layer.

(Support Substrate 40, Second Junction Layer 41)

A metal substrate made of a composite of 30% Cu and 70% W having thickness of 200 μm was used as an electrically conductive substrate 40, and the bonding layer made of Ti, the barrier layer made of Pt and the second eutectic-forming layer made of Au were formed on the metal substrate with thickness of 2000 Å-3000 Å-12000 Å, respectively.

(Bonding of Cu—W Support Substrate 40)

With the first junction layer 39 and the second junction layer 41 disposed to oppose each other, the bonding stack and the support substrate 40 were pressed to join while heating to 250° C. Thus eutectic was formed through diffusion of the metals of the first eutectic-forming layer and the second eutectic forming layer.

(Removing Sapphire Substrate 31)

The vessel wherein the bonded wafer is immersed in a treatment solution is moved to a laser irradiation apparatus where the wafer surface is irradiated with pulsed laser beam while moving a stage where the vessel is placed for scanning. Frequency of the pulses is set to 20 Hz, width of the laser beam spot on the surface is set to 100 μm, output power of the laser is set in a range from 90 to 200 mJ, and the speed of moving the stage (scanning speed of laser beam) is set to 1 mm/s. Energy density of the laser at the time of film removal is preferably 1 $J/cm^2$ or more. The buffer layer 33 or the high temperature growth layer 34 that is exposed is polished till the n-type cladding layer 35 made of AlGaN was exposed. The high temperature growth layer 34 may be removed by dry etching instead of polishing.

(n Electrode 42)

Then a multi-layer electrode consisting of Ti—Al—Ti—Pt—Au was formed on the n-type contact layer 35 with thickness of 100 Å-2500 Å-1000 Å-2000 Å-6000 Å, respectively, to make the n electrode 42. After polishing the electrically conductive substrate to a thickness of 100 μm, a multi-layer film of Ti—Pt—Au was formed on the back of the electrically conductive substrate as the pad electrode for the p electrode with thickness of 1000 Å-2000 Å-3000 Å, respectively. Last, the devices were separated by dicing, thereby to complete the nitride semiconductor device.

COMPARATIVE EXAMPLE 1

The nitride semiconductor device was made similarly to Example 1, except for removing the sapphire substrate 31 by irradiating it with excimer laser in air atmosphere.

Figure 7A:
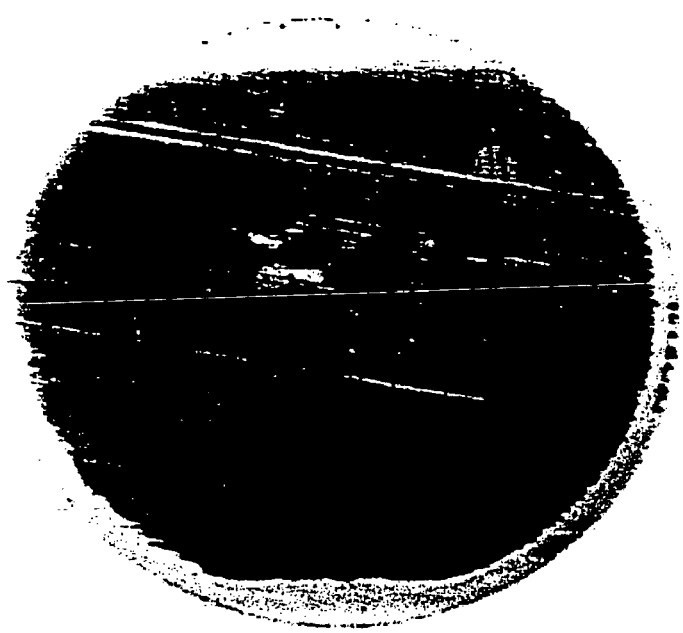
FIG. 7A is a photograph showing a nitride semiconductor layer after removing a disparate substrate therefrom in Example 1.
Figure 7B:
FIG. 7B is a photograph showing a nitride semiconductor layer after removing a disparate substrate therefrom in Comparative Example 1.

FIG. 7A and FIG. 7B are photographs showing the surface of the wafer after removing the sapphire substrate 31 therefrom in Example 1 and Comparative Example 1, respectively. In FIG. 7A and FIG. 7B, the black regions are those where the nitride semiconductor layer such as high temperature grown underlying layer of GaN or the like remains, white regions are where he Cu—W support substrate 40 located below the nitride semiconductor layer is exposed. As can be seen from FIG. 7A and FIG. 7B, a significant portion of the nitride semiconductor layer came off along with the sapphire substrate 31 when irradiated with excimer laser in air atmosphere in Comparative Example 1 (FIG. 7B), while the nitride semiconductor layer hardly came off when the sapphire substrate 31 was removed by irradiating it with excimer laser in the KOH etching solution in Example 1 (FIG. 7A). Yield of production per wafer was about 90% in Example 1 and about 60% in Comparative Example 1,

EXAMPLE 2

The wafer 18 from which the sapphire substrate has been removed from Example 1 is prepared, and is set in an etching apparatus shown in FIG. 9. In the procedure shown in FIGS. 8A through 8D, the underlying layer 32 made of GaN that is the first crystal layer 52 is selectively removed. This process will be described below.

As shown in FIG. 8A, the nitride semiconductor wafer 18 bonded to the support substrate 40 is prepared. As shown in FIG. 8B, surface of the first crystal layer 52 whereon the disparate substrate 30 has been provided (that is the surface opposing the interface 51b with the second crystal layer) is polished by CMP to decrease the thickness. At this time, surface of the first crystal layer 52 becomes convex since the nitride semiconductor wafer 18 is warped. Then as shown in FIG. 8C, the nitride semiconductor wafer 18 is immersed in the etching solution of KOH and is irradiated with ultraviolet ray having wavelength of 365 nm that is used as the excitation light 61. The excitation light is emitted by an LED light source. The excitation light 61 is applied to the surface of the first crystal layer 52 (polished surface) of the nitride semiconductor wafer, which causes the first crystal layer 52 to be completely removed as shown in FIG. 8D. When the surface 51b of the second crystal layer 51 is exposed, irradiation of the excitation light 61 is stopped and the wafer is taken out of the etching solution. The second crystal layer 52 thus obtained has satisfactorily flat surface 51b. Use of this second crystal layer 52 enables it to manufacture the device with better mass producibility.

While the present invention has been described in detail by way of preferred embodiments with reference to the accompanying drawings, it will be apparent to those skilled in the art that various alterations and modifications can be made. It is to be understood that such alterations and modifications that do not deviate from the appended claims are included in the present invention.

What is claimed is:

1. A method for manufacturing a nitride semiconductor wafer comprising removing a disparate substrate from a nitride semiconductor layer that is grown over said disparate substrate which is different from said nitride semiconductor, wherein removal of said disparate substrate is carried out by irradiating said disparate substrate with a laser light of a wavelength shorter than the band gap wavelength of said nitride semiconductor layer while supplying an acidic or alkaline etching solution to the interface between said disparate substrate and said nitride semiconductor layer.

2. The method for manufacturing a nitride semiconductor wafer according to claim 1, wherein said etching solution is one selected from the group consisting of KOH, sulfuric acid, phosphoric acid, hydrofluoric acid and pyrophosphoric acid.

3. The method for manufacturing a nitride semiconductor wafer according to claim 1, wherein said laser light is formed in a linear beam shape and is scanned over said disparate substrate.

4. The method for manufacturing a nitride semiconductor wafer according to claim 1, wherein said disparate substrate is removed from said nitride semiconductor layer after attaching said nitride semiconductor layer that is grown over said disparate substrate onto a support substrate.

5. The method for manufacturing a nitride semiconductor wafer according to claim 1, wherein said nitride semiconductor wafer from which said disparate substrate has been removed comprises an underlying layer of nitride semiconductor and a device structure that is provided over said underlying layer and includes an active layer which is capable of emitting ultraviolet ray, said underlying layer has a band gap energy lower than that of a portion of said device structure that is nearest to said underlying layer, said method further comprising removing said underlying layer from said nitride semiconductor wafer by irradiating said underlying layer with excitation light which has wavelength shorter than the band gap wavelength of said underlying layer, while immersing said nitride semiconductor wafer in an acidic or alkaline etching solution.

6. The method for manufacturing a nitride semiconductor wafer according to claim 5, wherein said excitation light is emitted by said active layer.

7. A method for manufacturing a nitride semiconductor device comprising:

growing a plurality of nitride semiconductor layers for forming devices over a disparate substrate which is different from nitride semiconductor, attaching a support substrate on the top surface of said nitride semiconductor layer, and removing said disparate substrate from said nitride semiconductor layer, wherein removal of said disparate substrate is carried out by irradiating said disparate substrate with a laser light of a wavelength shorter than the band gap wavelength of said nitride semiconductor layer that is located nearest to said disparate substrate, while supplying an acidic or alkaline etching solution to the interface between said disparate substrate and said nitride semiconductor layer.

8. The method for manufacturing a nitride semiconductor device according to claim 7, wherein said nitride semiconductor device is an ultraviolet emitting device that emits ultraviolet ray from an active layer, while the nitride semiconductor layer tat is located nearest to said disparate substrate is made of a material that absorbs the light emitted by said active layer and is removed after removing said disparate substrate.

9. The method for manufacturing a nitride semiconductor device according to claim 7, wherein the nitride semiconductor layer that is located nearest to said disparate substrate is removed by irradiating with excitation light having wavelength shorter than the emission wavelength of said active layer, while being supplied with said etching solution.

10. The method for manufacturing a nitride semiconductor device according to claim 9, wherein wavelength of the emission from said active layer is shorter than a band gap wavelength that corresponds to (E+0.1 eV), where E is the band gap energy of the nitride semiconductor layer located nearest to said disparate substrate.

11. The method for manufacturing a nitride semiconductor device according to claim 10, wherein said excitation light is emitted by said active layer.

12. A method for manufacturing a nitride semiconductor wafer, comprising:

forming a stack of nitride semiconductor layers by stacking a first crystal layer made of a nitride semiconductor and a second crystal layer having at least a nitride semiconductor that has band gap energy higher than that of said first crystal layer; and removing said first crystal layer by irradiating said first crystal layer with light having a wavelength shorter than the band gap wavelength of said first crystal layer, while immersing said stack of nitride semiconductor layers in an acidic or alkaline etching solution.

13. The method for manufacturing a nitride semiconductor wafer according to claim 12, wherein the forming step of said stack of nitride semiconductor layers comprises polishing said first crystal layer after forming said second crystal layer, wherein said first crystal layer has uneven thickness after polishing.

14. The method for manufacturing a nitride semiconductor wafer according to claim 13, wherein, in the forming step of said stack of nitride semiconductor layers, said first crystal layer and said second crystal layer are formed in this order over a disparate substrate that is made of a material different from nitride semiconductor, and said disparate substrate is removed, leaving a warped stack.

* * * * *